US 011503752 B2

(12) United States Patent
Ina

(10) Patent No.: US 11,503,752 B2
(45) Date of Patent: Nov. 15, 2022

(54) COMPONENT MOUNTING MACHINE

(71) Applicant: FUJI CORPORATION, Chiryu (JP)

(72) Inventor: Hiroaki Ina, Chiryu (JP)

(73) Assignee: FUJI CORPORATION, Chiryu (JP)

(*) Notice: Subject to any disclaimer, the term of this patent is extended or adjusted under 35 U.S.C. 154(b) by 804 days.

(21) Appl. No.: 16/333,464

(22) PCT Filed: Sep. 20, 2016

(86) PCT No.: PCT/JP2016/077671
§ 371 (c)(1),
(2) Date: Mar. 14, 2019

(87) PCT Pub. No.: WO2018/055669
PCT Pub. Date: Mar. 29, 2018

(65) Prior Publication Data
US 2019/0261541 A1 Aug. 22, 2019

(51) Int. Cl.
*B23P 19/00* (2006.01)
*H05K 13/04* (2006.01)
(Continued)

(52) U.S. Cl.
CPC ....... *H05K 13/0465* (2013.01); *B23K 1/0016* (2013.01); *B23K 3/0638* (2013.01);
(Continued)

(58) Field of Classification Search
CPC .. B23K 1/0016; B23K 3/0638; B23K 3/0559; B23K 3/082; B23K 2101/36;
(Continued)

(56) References Cited

U.S. PATENT DOCUMENTS 6,789,720 B2 9/2004 Uchida et al.
11,032,957 B2* 6/2021 Ichino ................ B65G 47/1471
(Continued)

FOREIGN PATENT DOCUMENTS

EP 1 213 083 A2 6/2002
EP 3 030 067 A1 6/2016
(Continued)

OTHER PUBLICATIONS

International Search Report dated Nov. 29, 2016 in PCT/JP2016/077671 filed on Sep. 20, 2016.
(Continued)

*Primary Examiner* — Paul D Kim
(74) *Attorney, Agent, or Firm* — Oblon, McClelland, Maier & Neustadt, L.L.P.

(57) ABSTRACT

Component mounting machine includes head, a device for moving head, transfer unit, and a mounting controller. Circular plate is an example of a container in which paste is placed. The bottom face of circular plate and the upper surface of the side wall have a predetermined height relationship. Height sensor is disposed on the lower face of head. Height sensor measures the height of the upper surface of the side wall of circular plate, which is a measurement point. The mounting controller recognizes the height of the bottom face of circular plate or the height of the surface of coating film disposed on circular plate from the height of the top surface of the side wall of circular plate measured by height sensor.

5 Claims, 6 Drawing Sheets

(51) Int. Cl.
*H05K 13/08* (2006.01)
*B23K 1/00* (2006.01)
*B23K 3/08* (2006.01)
*B23K 3/06* (2006.01)
*H05K 3/34* (2006.01)
*B23K 101/36* (2006.01)
*B23K 101/42* (2006.01)

(52) U.S. Cl.
CPC .............. *B23K 3/0669* (2013.01); *B23K 3/08* (2013.01); *B23K 3/082* (2013.01); *H05K 3/3436* (2013.01); *H05K 3/3485* (2020.08); *H05K 13/0409* (2018.08); *H05K 13/0812* (2018.08); *B23K 2101/36* (2018.08); *B23K 2101/42* (2018.08); *H05K 2203/163* (2013.01)

(58) Field of Classification Search
CPC ........... B23K 2101/42; H05K 13/0409; H05K 13/0465; H05K 13/0812; H05K 3/3436; H05K 3/3485; H05K 2203/163
See application file for complete search history.

(56) References Cited

U.S. PATENT DOCUMENTS

| | | |
|---|---|---|
| 2002/0070460 A1 | 6/2002 | Uchida et al. |
| 2005/0017052 A1 | 1/2005 | Uchida et al. |
| 2005/0023326 A1 | 2/2005 | Uchida et al. |
| 2005/0023681 A1 | 2/2005 | Uchida et al. |
| 2016/0174425 A1 | 6/2016 | Hayashi et al. |
| 2018/0201492 A1* | 7/2018 | Jung ................ B01D 35/04 |
| 2018/0317699 A1* | 11/2018 | Brunner ............ A47J 31/46 |

FOREIGN PATENT DOCUMENTS

| | | |
|---|---|---|
| JP | 2002-185117 A | 6/2002 |
| JP | 2014-78581 A | 5/2014 |

OTHER PUBLICATIONS

Extended European Search Report dated Aug. 22, 2019 in European Patent Application No. 16916740.0 citing documents AA, and AO-AP therein, 7 pages.

* cited by examiner

COMPONENT MOUNTING MACHINE

TECHNICAL FIELD

The present application relates to a component mounting machine.

BACKGROUND ART

A component mounting machine is known in which a component supplied from a component supply device is picked up by a nozzle provided in a head, and then the head is conveyed to a location above a board to mount the component on the board. In this case, solder paste may be printed in advance on a component mounting position of the board. In recent years, the decreasing amount of paste printed on boards due to miniaturization of component sizes has made it difficult to print the paste in accordance with design values. For this reason, instead of printing the paste on the component mounting position of the board, the coating film of the paste is transferred to connection terminals such as disposed on the lower face of the component (such as BGAs). In order to transfer the coating film of the paste to the connection terminals of the component in this manner, a component mounting machine for calculating the film thickness of the coating film formed on the bottom face of a container is also disclosed (see Patent Literature 1). In this component mounting machine, the height of the bottom face of the container is measured in advance in an empty state in which no coating film exists in the container, and thereafter, a coating film is formed on the bottom face of the container, the height of the surface of the coating film is measured, so that the difference between these heights is calculated as the film thickness.

PATENT LITERATURE

Patent Literature 1: JP-A-2014-78581

BRIEF SUMMARY

Technical Problem

However, in the component mounting machine described above, it is necessary to measure the height of the bottom face of the container in advance in an empty state in which the coating film does not exist in the container, since the height of the bottom face of the container cannot be known after the coating film is formed on the bottom face of the container.

The present disclosure has been made in view of the above problem, and it is a main object of the present disclosure to make it possible to recognize the height of the bottom face of the container or the height of the surface of the coating film regardless of whether the coating film is formed on the bottom face of the container.

Solution to Problem

A component mounting machine of the present disclosure comprises: a head having a component holding section capable of holding a component with connection terminals on a lower face; a head moving device for moving the head; a transfer device having a container with a predetermined height relationship between a bottom face and a predetermined measurement point different from the bottom face, and configured to provide paste as a coating film of a predetermined thickness on the bottom face of the container, the paste being to be transferred to the connection terminals of the component; a height sensor provided on the head and capable of measuring the height of the measurement point of the container; and a control device for controlling the head and the head moving device such that the coating film provided by the transfer device is transferred to the connection terminals of the component held by the component holding section, wherein the control device recognizes the height of the bottom face of the container or the height of the surface of the coating film from the height of the measurement point of the container measured by the height sensor.

In this component mounting machine, the height of the bottom face of the container or the height of the surface of the coating film is recognized from the height of the measurement point of the container measured by the height sensor. If the height of the measurement point of the container is known, the height of the bottom face of the container can be determined based on the predetermined height relationship between the bottom face of the container and the measurement point of the container. Alternatively, if the height of the measurement point of the container is known, the height of the surface of the coating film can be determined based on the predetermined height relationship between the bottom face of the container and the measurement point of the container and the predetermined thickness of the coating film. Therefore, the height of the bottom face of the container or the height of the surface of the coating film can be recognized regardless of whether the coating film is formed on the bottom face of the container.

In the component mounting machine of the present disclosure, the control device may recognize the height of the bottom face of the container from the height of the measurement point of the container to determine whether the container is properly positioned based on the height of the bottom face of the container, and notify the operator with a warning if the container is not properly positioned. As a consequence of the warning being outputted, the operator becomes aware that the container is not properly positioned and can correct the position of the container.

In the component mounting machine of the present disclosure, the control device may recognize the height of the surface of the coating film from the height of the measurement point of the container, and may set the height, at which the connection terminals of the component held by the component holding section are dipped into the coating film, based on the height of the surface of the coating film. In this way, even if the height of the surface of the coating film changes as the height of the bottom face of the container changes, the coating film of the paste can be reliably transferred to the connection terminals of the component.

In the component mounting machine of the present disclosure, the measurement point of the container may be three or more measurement points in such a way as to form vertices of a polygon. In this case, if the bottom face of the container is inclined, the inclination can be recognized.

In the component mounting machine of the present disclosure, the measurement point of the container may be set to the upper surface of the side wall surrounding the bottom face of the container. Since there is little possibility that the paste adheres to the upper surface of the side wall surrounding the bottom face of the container, the height sensor can accurately measure the height of the measurement point of the container.

In the component mounting machine of the present disclosure, the height sensor may be an optical sensor. This makes it possible to measure the height of the measurement point of the container without contacting the measurement point, thereby improving the measurement accuracy.

DESCRIPTION OF EMBODIMENTS

Figure 1:
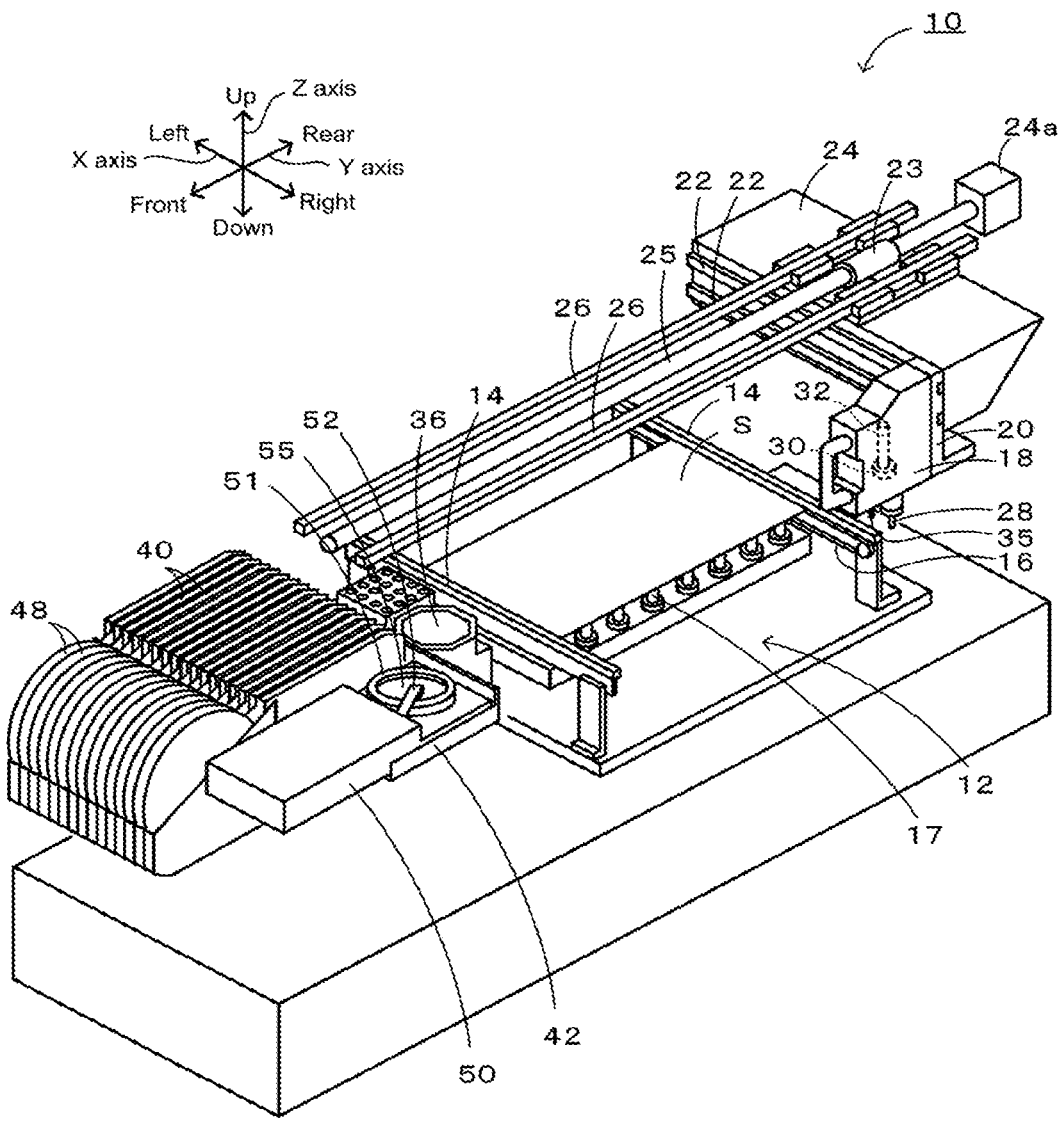
FIG. 1 is a perspective view of component mounting machine 10.
Figure 2:
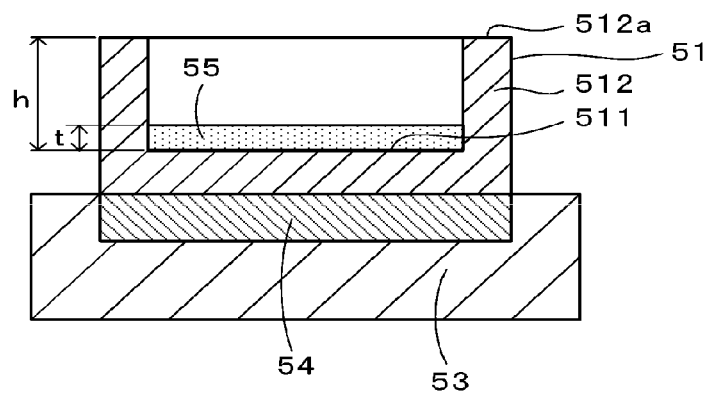
FIG. 2 is a sectional view of circular plate 51 and its peripheral member.
Figure 3:
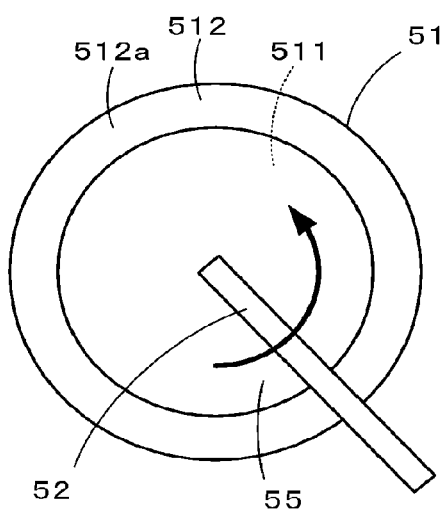
FIG. 3 is a plan view of circular plate 51.
Figure 4:
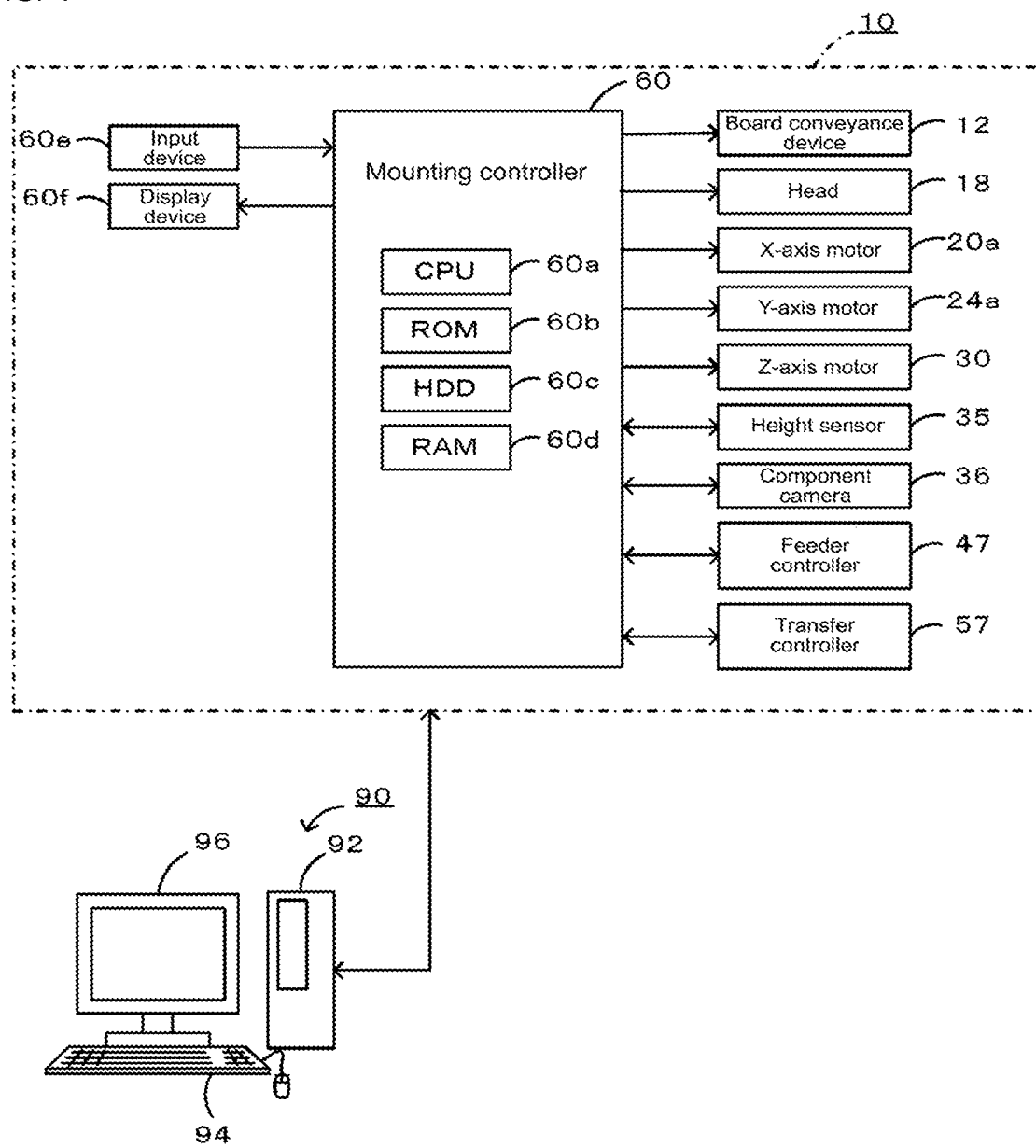
FIG. 4 is a view showing electrical connections of component mounting machine 10.

A preferred embodiment of the present disclosure will be described below with reference to the drawings. FIG. 1 is a perspective view of component mounting machine 10, FIG. 2 is a sectional view of circular plate 51 and its peripheral members, FIG. 3 is a plan view of circular plate 51, and FIG. 4 is a view showing electrical connections of component mounting machine 10. In the present embodiment, the left-right direction (X-axis), the front-rear direction (Y-axis), and the up-down direction (Z-axis) are as shown in FIG. 1. In FIG. 2, an illustration of squeegee 52 is omitted.

As shown in FIG. 1, component mounting machine 10 includes board conveyance device 12, head 18, nozzle 28, height sensor 35, component camera 36, tape feeder 40, transfer unit 50, and mounting controller 60 (see FIG. 2) for executing various controls.

Board conveyance device 12 transfers board S from left to right with conveyor belts 16, 16 (only one of which is shown in FIG. 1) attached to left and right conveyor rails 14, 14, respectively. Further, board conveyance device 12 fixes board S by lifting S from below with support pins 17 disposed below board S and pressing board S against the guide portions of conveyor rails 14, 14, and releases the fixation of board S by lowering support pins 17.

Head 18 has nozzle 28 on its lower face. Head 18 is detachably attached to the front face of X-axis slider 20. X-axis slider 20 is slidably attached to upper and lower guide rails 22, 22 disposed on the front face of Y-axis slider 24 and extending in the left-right direction. Y-axis slider 24 is integrated with nut 23 screwed to Y-axis ball screw 25, and is slidably attached to left and right guide rails 26, 26 extending in the front-rear direction. One end of Y-axis ball screw 25 is attached to Y-axis motor 24a, and the other end is a free end. Y-axis slider 24 slides along guide rails 26, 26 by a ball screw mechanism. That is, when Y-axis motor 24a rotates, Y-axis ball screw 25 rotates, and nut 23 slides along guide rails 26, 26 together with Y-axis slider 24. Although not shown, X-axis slider 20 slides along guide rails 22, 22 by a ball screw mechanism including X-axis motor 20a (see FIG. 2), similarly to Y-axis slider 24. Head 18 moves in the left-right direction as X-axis slider 20 moves in the left-right direction, and moves in the front-back direction as Y-axis slider 24 moves in the front-back direction.

Nozzle 28 controls pressure to pick up components to the nozzle tip or release components that are picked up by the nozzle tip. The height of nozzle 28 is adjusted by Z-axis motor 30 incorporated in head 18 and ball screw 32 extending along the Z-axis.

Height sensor 35 is attached to the lower face of head 18. Height sensor 35 is an optical sensor having a light-emitting element and a light-receiving element. Height sensor 35 measures the distance from height sensor 35 to a measurement target by emitting light from the light-emitting element toward the measurement target and receiving the reflected light with the light-receiving element.

Component camera 36 is installed between device pallet 42 and board conveyance device 12 so that the imaging direction is upward at substantially the center of the length in the left-right direction. Component camera 36 captures an image of a component picked up by nozzle 28 passing above component camera 36.

Tape feeder 40 is a kind of component supply device and is attached to device pallet 42 in the front of component mounting machine 10. Device pallet 42 has a number of slots (not shown) in its upper face, where tape feeder 40 is inserted into the respective slot. Tape feeder 40 rotatably holds reel 48 on which tape is wound. The tape is formed with multiple recesses (not shown) arranged along the longitudinal direction of the tape. Each recess accommodates a component. These components are protected by a film (not shown) covering the surface of the tape. Tape feeder 40 defines a component pick up position. The component pickup position is a position fixed by design at which nozzle 28 picks up a component. Every time the tape is fed backward by a predetermined amount by tape feeder 40, the components accommodated in the tape are sequentially arranged at the component pickup position. The component, which reaches the component pickup position with the film being peeled off, is picked up by suction force of nozzle 28.

Transfer unit 50 is detachably inserted into multiple slots of device pallet 42 that are not occupied by tape feeders 40. Transfer unit 50 includes circular plate 51 and squeegee 52. As shown in FIG. 2, circular plate 51 is fixed to the upper face of rotary table 54, disposed on block-shaped base 53, and rotates integrally with rotary table 54. The arrow in FIG. 3 indicates the rotational direction of circular plate 51. Circular plate 51 has circular bottom face 511 and side wall 512 surrounding bottom face 511. Bottom face 511 and upper face 512a of side wall 512 have a predetermined height relationship. Here, upper face 512a of side wall 512 is disposed parallel to flat bottom face 511 and has height h from bottom face 511. Upper face 512a of side wall 512 is polished so that light is easily reflected. Squeegee 52 forms coating film 55 having predetermined thickness t by smoothing the flux paste supplied from a paste supply line (not shown) into circular plate 51. Squeegee 52 is secured to base 53, as shown in FIG. 3, extending in the radial direction of circular plate 51. Therefore, when rotary table 54 rotates, circular plate 51 rotates, and the flux paste in circular plate 51 is leveled by squeegee 52 to form coating film 55 having predetermined thickness t. The surface of coating film 55 is parallel to bottom face 511.

Mounting controller 60 is a microprocessor configured around CPU 60a, as shown in FIG. 4, and includes ROM 60*b* for storing a processing program, HDD 60*c* for storing various types of data, RAM 60*d* used as a working area, and the like. Input device 60*e*, such as a mouse and a keyboard, and display device 60*f*, such as a liquid crystal display, are connected to mounting controller 60. Mounting controller 60 is connected to feeder controller 47 built into tape feeder 40, transfer controller 57 built into transfer unit 50, and management computer 90 in a manner that is capable of bidirectional communication. Mounting controller 60 is connected so that control signals are outputted to board conveyance device 12, head 18, X-axis motor 20*a*, Y-axis motor 24*a*, Z-axis motor 30, height sensor 35, and component camera 36. Mounting controller 60 is connected so that signals are received from height sensor 35 and component camera 36.

As shown in FIG. 4, management computer 90, including personal computer main body 92, input device 94, and display 96, can receive signals from input device 94 operated by an operator, and output various images to display 96. Production job data is stored in the memory of personal computer main body 92. The production job data defines which components are mounted on board S in what order in component mounting machine 10, and how many boards S thus mounted are to be produced.

Figure 5:
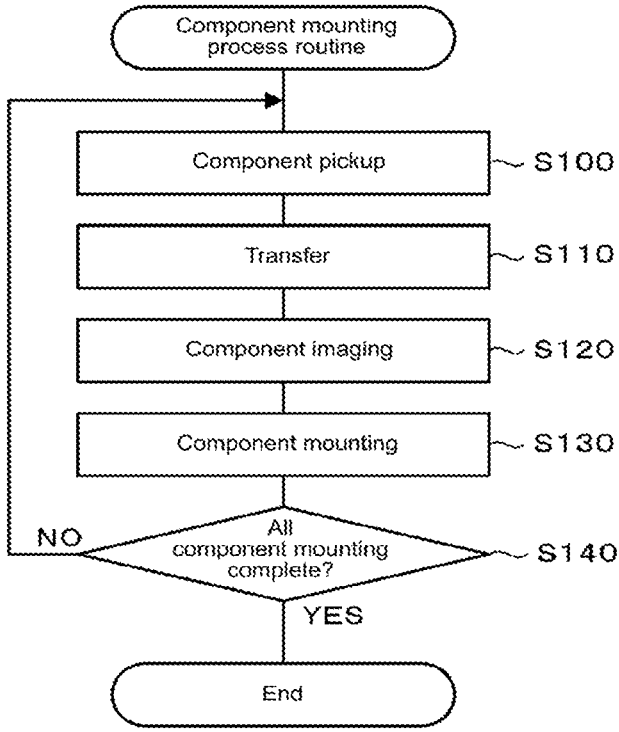
FIG. 5 is a flowchart of a component mounting process routine.

Next, an operation of mounting a component on board S by mounting controller 60 of component mounting machine 10 based on a production job, i.e., a component mounting processing routine, will be described. The program of the component mounting processing routine is stored in ROM 60*b* of mounting controller 60. CPU 60*a* of mounting controller 60 reads out and executes this program from ROM 60*b* upon being instructed to initiate component mounting processing. FIG. 5 is a flowchart of the component mounting processing routine.

First, CPU 60*a* causes nozzles 28 of head 18 to pick up component P supplied from tape feeder 40 (step S100). Specifically, CPU 60*a* causes X-axis motor 20*a* of X-axis slider 20 and Y-axis motor 24*a* of Y-axis slider 24 to move nozzle 28 of head 18 directly above the component pickup position of a desired component. Thereafter, CPU 60*a* causes Z-axis motor 30 to lower nozzle 28 and supply negative pressure to nozzle 28. As a result, the desired component is picked up with the tip of nozzle 28. CPU 60*a* then raises nozzle 28 to a normal position. The normal position is set to a height at which the component does not come into contact with any member constituting component mounting machine 10 even if nozzle 28 picking up the component moves in an XY direction.

Next, CPU 60*a* transfers coating film 55 to connecting terminals disposed on the lower face of the component (step S110). More specifically, CPU 60*a* causes X-axis slider 20 and Y-axis slider 24 to move nozzle 28 having the components attached to the tip thereof to a location above a predetermined dipping position of circular plate 51. Then, CPU 60*a* lowers nozzle 28 at the dipping position to transfer coating film 55 to the connection terminals disposed on the lower face of the component picked up by nozzle 28. The extent to which nozzle 28 is lowered at this time is set based on the height of the surface of coating film 55 so that coating film 55 adheres to the tips of the connection terminals. The height of the surface of coating film 55 is calculated by a pre-process routine which will be described later. CPU 60*a* then raises nozzle 28 to the normal position. Since the coating film 55 at the dipping position is recessed by the transfer, CPU 60*a* causes squeegee 52 to re-form coating film 55 in preparation for the next transfer.

Next, CPU 60*a* causes component camera 36 to capture an image of the component picked up by the tip of nozzle 28 (step S120). More specifically, CPU 60*a* causes X-axis slider 20 and Y-axis slider 24 to move nozzle 28 having the component picked up by the tip thereof to a location above component camera 36, and causes component camera 36 to image the component. Then, CPU 60*a* confirms that the component is picked up by the tip of nozzle 28 based on the captured image. If it is not confirmed that the component is picked up by the tip of nozzle 28, CPU 60*a* returns to S100.

Next, CPU 60*a* performs control so that the component picked up by the tip of nozzle 28 is mounted to a predetermined position of board S (step S130). More specifically, CPU 60*a* causes X-axis slider 20 and Y-axis slider 24 to move the component picked up by nozzle 28 to a position above board S. Then, CPU 60*a* lowers nozzle 28 at the predetermined position and causes atmospheric pressure to be supplied to nozzle 28. As a result, the component picked up by nozzle 28 is released and mounted at the predetermined position on board S.

Next, CPU 60*a* determines whether mounting of all components to be mounted on board S has been completed (step S140). If there is a component to be mounted on board S still remaining in step S140, CPU 60*a* repeats the processing of step S100 and subsequent steps. On the other hand, if mounting of all components is completed in S140, the CPU 60*a* ends the current routine.

Figure 6:
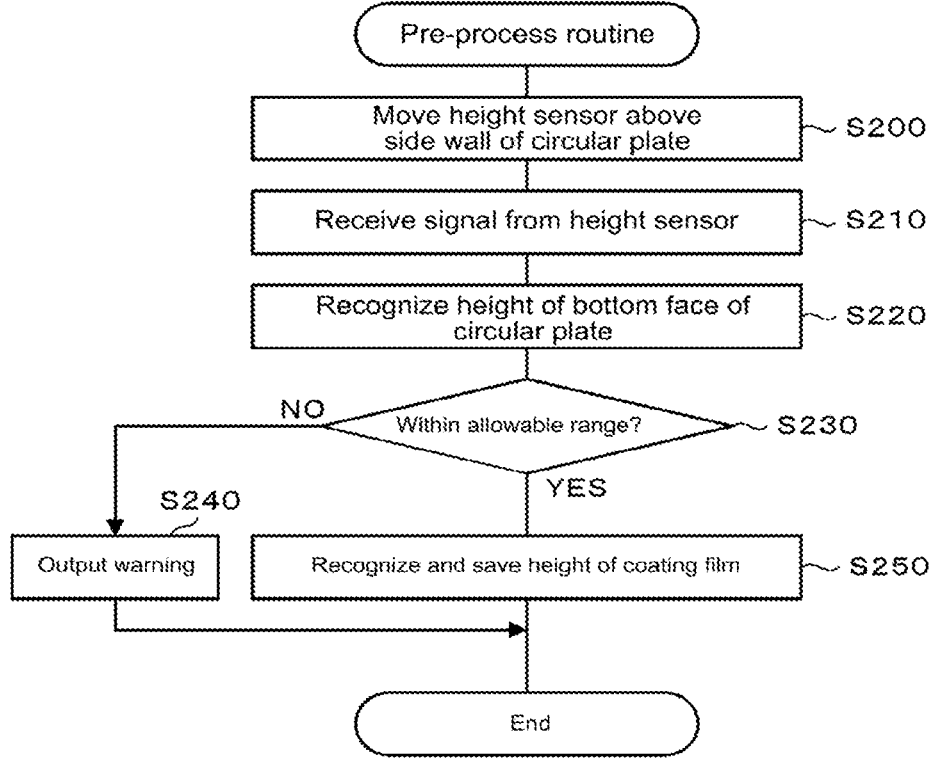
FIG. 6 is a flowchart of a pre-process routine.
Figure 7:
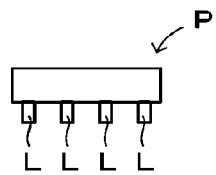
FIG. 7 is a view of component P.

Next, a pre-process routine executed by mounting controller 60 of component mounting machine 10 will be described. The program for the pre-process routine is stored in ROM 60*b* of mounting controller 60. CPU 60*a* of mounting controller 60 reads and executes the program for the pre-process routine from ROM 60*b* before executing the component mounting processing routine described above. FIG. 6 is a flowchart of the component mounting processing routine. Hereinafter, component P shown in FIG. 7 will be used an example of a component having connection terminals on the lower face. In component P, multiple (four) lead terminals L are linearly provided on the lower face of a rectangular parallelepiped-shaped member.

Figure 8:
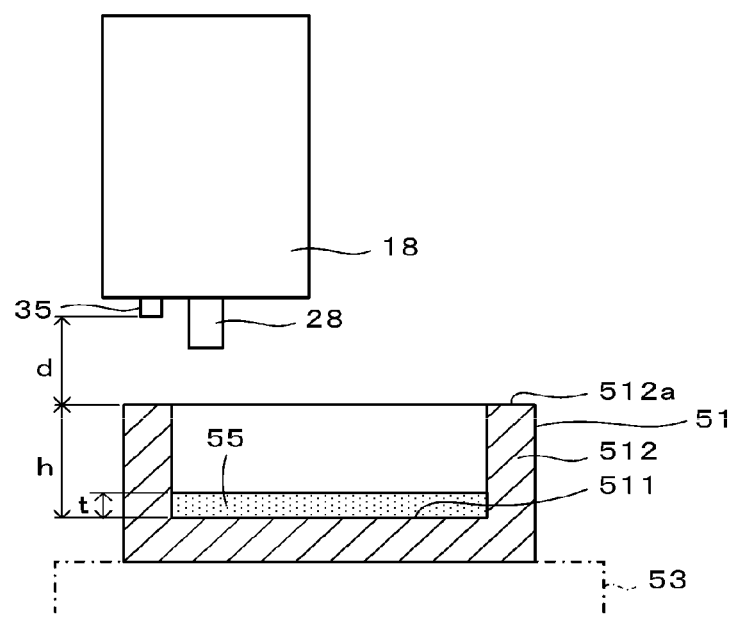
FIG. 8 is a view of height sensor 35 measuring the height of upper surface 512a of side wall 512.

First, CPU 60*a* moves height sensor 35 to a location directly above side wall 512 of circular plate 51 (step S200). More specifically, CPU 60*a* controls X-axis slider 20 and Y-axis slider 24 to move height sensor 35 disposed on the lower face of head 18 to a location directly above side wall 512 of circular plate 51. This state is shown in FIG. 8. The height of the lower face of head 18 is constant. Therefore, the height of height sensor 35 is also constant.

Next, CPU 60*a* receives signals from height sensor 35 (step S210) and recognizes the height of bottom face 511 of circular plate 51 (step S220). Specifically, CPU 60*a* recognizes distance d from the position of height sensor 35 to upper surface 512*a* of side wall 512 based on signals from height sensor 35, and recognizes the height of bottom face 511 (for example, the distance from height sensor 35 to bottom face 511) using distance d and height h from bottom face 511 to upper surface 512*a*.

CPU 60*a* determines whether the height of bottom face 511 is within an allowable range (step S230). Here, the allowable range is set to the numerical range of heights from bottom face 511 of circular plate 51 when transfer unit 50 is properly mounted on device pallet 42. For example, when transfer unit 50 is mounted out of the slot of device pallet 42, the height of bottom face 511 is out of the allowable range.

If it is determined in step S230 that the height of bottom face 511 is outside the allowable range, CPU 60*a* outputs a warning (step S240) and ends the present routine. A warning is outputted, for example, by displaying the words "The transfer unit is not properly mounted" on display device 60*f* or by generating a warning sound by voice from a built-in speaker of component mounting machine 10.

On the other hand, if it is determined in step S230 that the height of bottom face 511 is within the allowable range, the CPU 60*a* recognizes the height of the surface of coating film 55, stores the height in RAM 60*d* (step S240), and ends the routine. Specifically, the CPU 60*a* recognizes the height of the coating film 55 (e.g., the distance from height sensor 35 to the surface of coating film 55) based on predetermined thickness t of coating film 55 in addition to distance d and height h described above, and stores it in RAM 60*d*.

Figure 9:
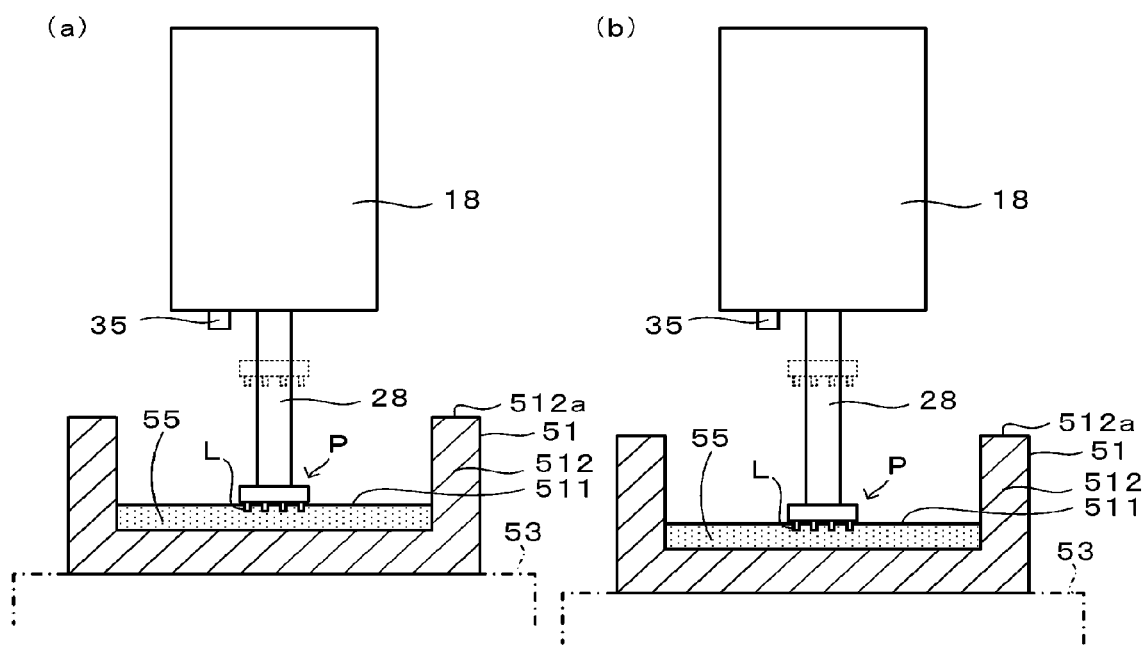
FIG. 9 is a figure showing the transfer of coating film 55 to lead terminals L of component P, wherein (a) shows circular plate 51 at a designated position and (b) shows circular plate 51 at a position lower than the designated position.

CPU 60*a* sets the descending distance of nozzle 28 based on the height of the surface of coating film 55 stored in RAM 60*d* when the transfer is performed in S110 of the component mounting processing routine to be executed later. A specific example thereof will be described with reference to FIG. 9. When nozzle 28 is disposed above the predetermined dipping position of circular plate 51, as indicated by a dotted line, component P is positioned at a height at which it does not interfere with various members constituting component mounting machine 10 even if head 18 moves in the XY direction. Based on the height of the surface of coating film 55, CPU 60*a* lowers nozzle 28 from the position indicated by the dotted line to the position at which the tips of lead terminals L are dipped into coating film 55 and coating film 55 is transferred to the tips (see component P indicated by a solid line). FIG. 9(*a*) shows an example in which circular plate 51 is disposed at a designated position with high accuracy, and FIG. 9(*b*) shows an example in which circular plate 51 is disposed at a lower position than the designated position. In FIG. 9B, since the surface of coating film 55 is at a position lower than the position in FIG. 9A, the descending distance of nozzle 28 is larger than the descending distance in FIG. 9A.

Here, the correspondence between the configuration elements of the present embodiment and the constituent elements of the present disclosure will be described. X-axis slider 20, X-axis motor 20*a*, Y-axis slider 24, and Y-axis motor 24*a* of the present embodiment correspond to a head moving device of the present disclosure, transfer unit 50 corresponds to a transfer device, and mounting controller 60 corresponds to a control device. Nozzle 28 corresponds to a component holding section, circular plate 51 corresponds to a container, and upper surface 512*a* of side wall 512 corresponds to a measurement point.

In component mounting machine 10 described above, the height of bottom face 511 of circular plate 51 and the height of the surface of coating film 55 are recognized from the height of upper surface 512*a* of side wall 512 of circular plate 51 measured by height sensor 35. Therefore, regardless of whether coating film 55 is formed on bottom face 511 of circular plate 51, the height of bottom face 511 of circular plate 51 and the height of the surface of coating film 55 can be recognized.

Further, it is determined whether circular plate 51 (and thus transfer unit 50) is properly disposed on the basis of the height of bottom face 511 of circular plate 51, and if it is not properly disposed, a warning is outputted to the operator. As a consequence of the warning being outputted, the operator becomes aware that circular plate 51 is not properly positioned and can correct the position of transfer unit 50.

Further, the height of the surface of coating film 55 determines the height at which lead terminals L of component P picked up by nozzle 28 are dipped into coating film 55. Therefore, even if the height of the surface of coating film 55 changes as the height of bottom face 511 of circular plate 51 changes, coating film 55 of the paste can be reliably transferred to lead terminals L of component P.

Furthermore, the measurement point of circular plate 51 is set to upper surface 512*a* of side wall 512 surrounding bottom face 511. Since there is little possibility that the paste adheres to upper surface 512*a* of side wall 512, height sensor 35 can accurately measure the height of upper surface 512*a* of side wall 512.

Further, since an optical sensor is used as height sensor 35, the height of the measurement point can be measured without contacting the measurement point of circular plate 51. As a result, the measurement accuracy is high.

It is to be understood that the present disclosure is not limited to the above-described embodiment, and may be implemented in various modes as long as it falls within the technical scope of the disclosure.

Figure 10:
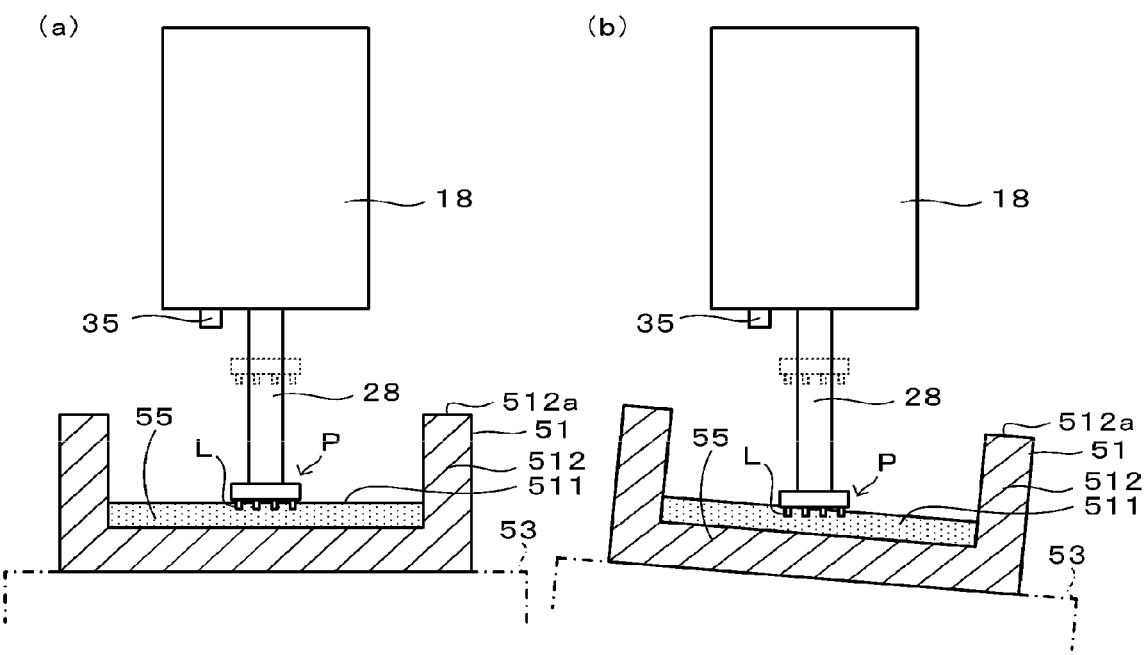
FIG. 10 is a figure of coating film 55 being transferred to lead terminals L of component P, wherein (a) shows a case where circular plate 51 is in the designated position, and (b) shows a case where circular plate 51 is inclined from the designated position.

For example, in the embodiment described above, in the pre-process routine, only one point of upper surface 512*a* of side wall 512 of circular plate 51 is measured by height sensor 35, but three predetermined points of upper surface 512*a* forming a triangle may be measured by height sensor 35. In this way, the height of upper surface 512*a* and the inclination angle of upper surface 512*a* with respect to the horizontal plane can be recognized from the three heights, and the heights and the inclination angles with respect to the horizontal plane of the surface of bottom face 511 and coating film 55 can be recognized. Further, CPU 60*a* may output a warning if the height or inclination angle of bottom face 511 falls outside a predetermined allowable range. On the other hand, if the inclination angle is within the allowable range, CPU 60*a* may set the descending distance of nozzle 28 in accordance with the height and inclination angle of the surface of coating film 55 when transferring in step S110 of the component mounting processing routine. A specific example thereof will be described with reference to FIG. 10. Based on the inclination angle of the surface of coating film 55, the CPU 60*a* lowers nozzles 28 from the position indicated by the dotted line to the position where the tips of lead terminals L are dipped into coating film 55 and coating film 55 is transferred to the tips (see component P indicated by the solid line). FIG. 10(*a*) shows an example in which circular plate 51 is disposed at the designated position with high accuracy, and FIG. 10(*b*) shows an example in which circular plate 51 (i.e., transfer unit 50) is disposed inclined from the designated position. In FIG. 10(*b*), coating film 55 is parallel to bottom face 511 because of its high viscosity. The measurement point may be multiple predetermined points forming a polygon.

In the embodiment described above, an optical sensor is used as an example for height sensor 35, but the present disclosure is not particularly limited thereto, and may be, for example, an ultrasonic sensor or a contact type displacement sensor. However, in the case of the contact type displacement sensor, it is necessary to contact the side wall of the plate which is the measurement target, whereas in the case of the non-contact type displacement sensor such as an optical sensor or an ultrasonic sensor, it is not necessary to contact the side wall of the plate, thereby allowing the non-contact type displacement sensor to measure heights with higher accuracy.

In the embodiment described above, the measurement point is upper surface 512*a* of the side wall 512 of circular plate 51, but the measurement point is not particularly limited thereto, and for example, a lip may be provided along the outer peripheral surface of side wall 512 of circular plate 51, and the upper surface of the lip may be the measurement point.

In the embodiment described above, the height of bottom face 511 of circular plate 51 is recognized in step S220 of the pre-process routine, and the height of the surface of coating film 55 is recognized in step S250, but the present disclosure is not particularly limited thereto, and only the height of bottom face 511 may be recognized, or only the height of the surface of coating film 55 may be recognized.

In the embodiment described above, transfer unit 50 transfers coating film 55 of flux paste to lead terminals L of component P, but the present disclosure is not particularly limited thereto, and for example, a coating film of solder paste may be transferred to lead terminals L of component P.

In the embodiment described above, the case in which coating film 55 is transferred to multiple lead terminals L disposed on lower face of component P is used as an example, but the present disclosure is not particularly limited thereto, and for example, coating film 55 may be transferred to a hemispherical bump instead of lead terminals L.

In the embodiment described above, tape feeder 40 is used as an example of a component supply device, but the present disclosure is not particularly limited thereto, and for example, a tray unit having a magazine in which a large number of trays are stacked in a vertical direction may be used as a component supply device.

In the embodiment described above, head 18 has only one nozzle 28, but may be provided with multiple nozzles.

In the embodiment described above, nozzle 28 capable of picking up a component is used as an example of a component holding section, but the present disclosure is not particularly limited thereto, and for example, an arm capable of grasping a component may be used.

In the embodiment described above, circular plate 51 is used as an example of a container of transfer unit 50, but the present disclosure is not particularly limited thereto, and a plate having a polygonal shape in plan view, for example, a square shape, may be adopted.

In the embodiment described above, squeegee 52 is fixed and circular plate 51 is rotated, but circular plate 51 may be fixed and squeegee 52 may be rotated.

In the embodiment described above, the descending distance of nozzle 28 is set based on the height of the surface of coating film 55, but the descending distance of nozzle 28 may be set based on the height of bottom face 511 of circular plate 51. For example, the height of bottom face 511 may be the dip height, that is, the height of the lower end of lead terminals L of component P. In this case, the transfer amount of the paste to component P can be controlled by thickness t of coating film 55.

INDUSTRIAL APPLICABILITY

The component mounting machine of the present disclosure can be used when mounting an electronic component on a board.

REFERENCE SIGNS LIST 10 component mounting machine, 12 board conveyance device, 14 conveyor rail, 16 conveyor belt, 17 support pins, 18 head, 20 X-axis slider, 20a X-axis motor, 22 guide rail, 23 nut, 24 Y-axis slider, 24a Y-axis motor, 25 Y-axis ball screw, 26 guide rail, 28 nozzle, 30 Z-axis motor, 32 ball screw, 35 height sensor, 36 component camera, 40 tape feeder, 42 device pallet, 47 feeder controller, 48 reel, 50 transfer unit, 51 circular plate, 511 bottom face, 512 side wall, 512a upper surface, 52 squeegee, 53 base, 54 rotary table, 55 coating film, 57 transfer controller, 60 mounting controller, 60a CPU, 60b ROM, 60c HDD, 60d RAM, 60e input device, 60f display device, 90 management computer, 92 personal computer main body, 94 input device, 96 display.

The invention claimed is:

1. A component mounting machine, comprising:
a head having a component holding section configured to hold a component with connection terminals on a lower face;
a head moving device for moving the head;
a transfer device having a container with a predetermined height relationship between a bottom face and a measurement point different from the bottom face, and configured to provide paste as a coating film of a predetermined thickness on the bottom face of the container, the paste being to be transferred to the connection terminals of the component;
a height sensor provided on the head and configured to measure a height of the measurement point of the container; and
a control device configured to
control the head and the head moving device such that the coating film provided by the transfer device is transferred to the connection terminals of the component held by the component holding section, and
recognize a height of the bottom face of the container or a height of a surface of the coating film from the height of the measurement point of the container measured by the height sensor,
wherein three or more measurement points of the container are set as vertices of a polygon.

2. The component mounting machine of claim 1, wherein the control device recognizes the height of the bottom face of the container from the height of the measurement point of the container, determines whether the container is properly positioned based on the height of the bottom face of the container, and notifies an operator with a warning if the container is not properly positioned.

3. The component mounting machine according to claim 1, wherein the control device recognizes the height of the surface of the coating film from the height of the measurement point of the container, and sets the height at which connection terminals of the component held by the component holding section are dipped into the coating film based on the height of the surface of the coating film.

4. The component mounting machine according to claim 1, wherein
the measurement point of the container is set to an upper surface of a side wall surrounding the bottom face of the container.

5. The component mounting machine according to claim 1, wherein
the height sensor is an optical sensor.

* * * * *